US012793614B2

(12) United States Patent
Ranjan et al.

(10) Patent No.: US 12,793,614 B2
(45) Date of Patent: Nov. 10, 2026

(54) METHODS AND SYSTEMS FOR REDUCING POWER CONSUMPTION OF ELECTRONIC DISPLAYS WITH IN-PIXEL SRAM CELL AND UNWEIGHTED PWM DRIVING SCHEME

(71) Applicants: Shubham Ranjan, Waterloo (CA); Manoj Sachdev, Waterloo (CA)

(72) Inventors: Shubham Ranjan, Waterloo (CA); Manoj Sachdev, Waterloo (CA)

( * ) Notice: Subject to any disclaimer, the term of this patent is extended or adjusted under 35 U.S.C. 154(b) by 0 days.

(21) Appl. No.: 19/046,675

(22) Filed: Feb. 6, 2025

(65) Prior Publication Data

US 2025/0252909 A1 Aug. 7, 2025

Related U.S. Application Data

(60) Provisional application No. 63/550,177, filed on Feb. 6, 2024.

(51) Int. Cl.

| | |
|---|---|
| ***G09G 3/32*** | (2016.01) |
| ***G09G 3/3233*** | (2016.01) |
| ***G09G 3/36*** | (2006.01) |
| ***G11C 7/06*** | (2006.01) |
| ***G11C 8/16*** | (2006.01) |
| ***G11C 11/412*** | (2006.01) |
| ***G11C 11/413*** | (2006.01) |

(Continued)

(52) U.S. Cl.
CPC ............. *G09G 3/32* (2013.01); *G09G 3/3233* (2013.01); *G09G 3/3685* (2013.01); *G11C 7/065* (2013.01); *G11C 8/16* (2013.01); *G11C 11/412* (2013.01); *G11C 11/413* (2013.01); *G11C 11/419* (2013.01); *G11C 19/28* (2013.01); *G09G 2300/0439* (2013.01); *G09G 2300/0842* (2013.01); *G09G 2300/0857* (2013.01); *G09G 2310/0286* (2013.01); *G09G 2310/06* (2013.01); *G09G 2330/021* (2013.01)

(58) Field of Classification Search
CPC ...... G09G 3/3685; G09G 3/3233; G09G 3/32; G09G 2300/0857; G09G 2300/0439; G11C 11/412; G11C 11/411; G11C 19/28; G11C 8/16; G11C 11/419; G11C 11/4091; G11C 11/005; G11C 7/065; G11C 11/413; H04N 25/77
See application file for complete search history.

(56) References Cited

U.S. PATENT DOCUMENTS 9,418,729 B2 * 8/2016 Fujiwara ............... G11C 11/419
2007/0268740 A1 * 11/2007 Aly ....................... G11C 11/412 365/154

(Continued)

OTHER PUBLICATIONS

J.-K. Cho and M. Jeong, "A Low-Voltage-Driven High-Voltage SRAM Pixel Circuit for Power Reduction in a Digital Micro-Display Panel," in IEEE Transactions on Circuits and Systems I: Regular Papers, vol. 67, No. 5, pp. 1640-1652, May 2020, doi: 10.1109/TCSI.2019.2962820.

(Continued)

*Primary Examiner* — Dismery Mercedes
(74) *Attorney, Agent, or Firm* — Perry + Currier Inc.

(57) ABSTRACT

The disclosure is directed at systems and methods for reducing power consumption of electronic displays with in-pixel SRAM or DRAM cell and unweighted pulse width modulation (PWM) scheme.

6 Claims, 11 Drawing Sheets

Figure 1A:
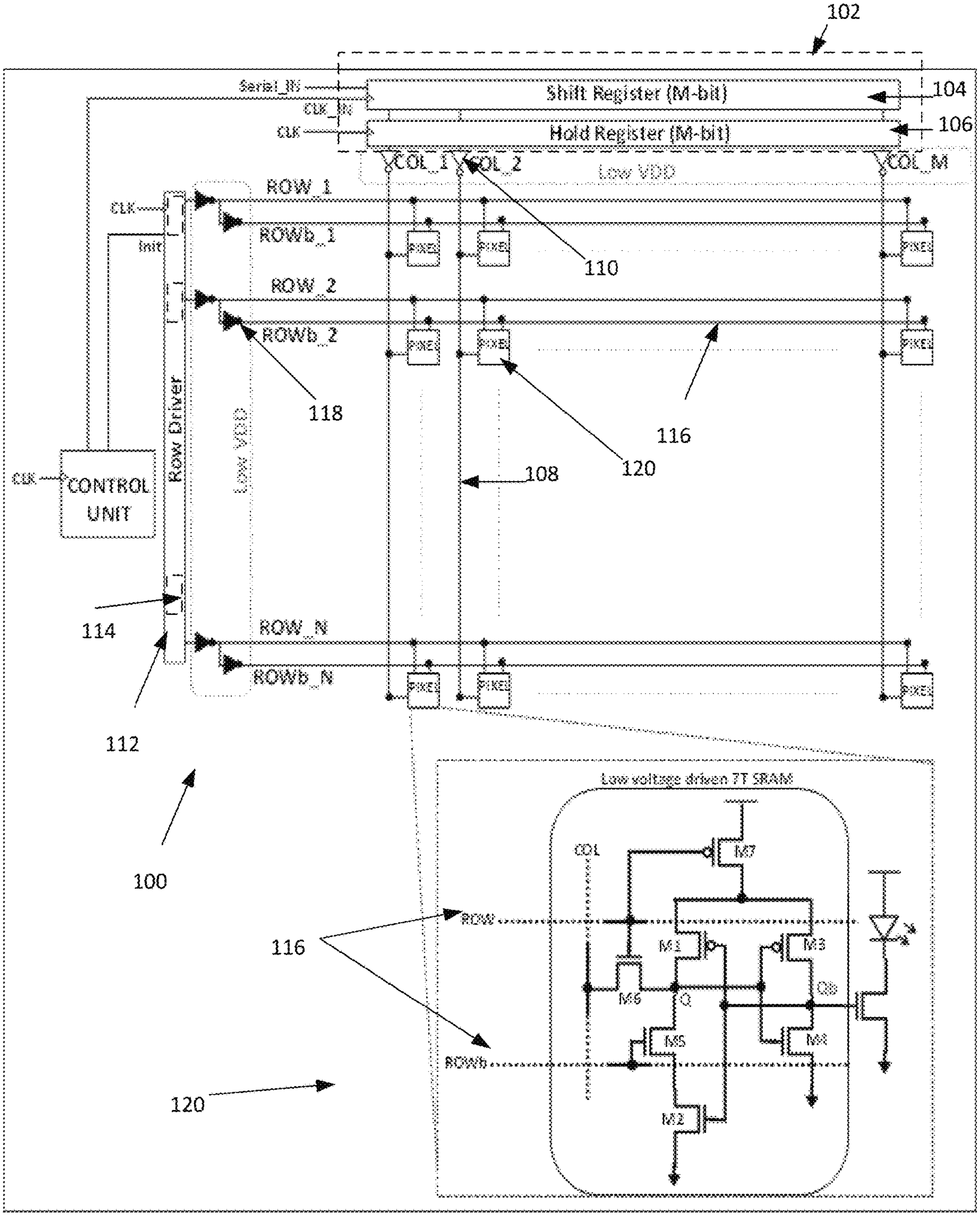

(51) Int. Cl.
*G11C 11/419* (2006.01)
*G11C 19/28* (2006.01)

(56) References Cited

U.S. PATENT DOCUMENTS

2009/0161410 A1* 6/2009 Houston ............... G11C 11/412
365/189.14
2010/0315862 A1* 12/2010 Huang .................. G11C 11/419
365/156
2013/0106825 A1* 5/2013 Lapidus ............... G09G 3/3696
345/212
2013/0107609 A1* 5/2013 Chang ................... G11C 11/412
365/154
2014/0204658 A1* 7/2014 Wuu ..................... G11C 11/412
365/189.011
2014/0218414 A1* 8/2014 Kikuchi ............... G09G 3/3233
327/434
2019/0114987 A1* 4/2019 Li ........................ G09G 3/3233
2019/0259132 A1* 8/2019 Miyasaka ............ H10K 59/131
2021/0142729 A1* 5/2021 Gai ...................... G09G 3/3291
2021/0256901 A1* 8/2021 Hudson ................ G09G 3/3426
2022/0327996 A1* 10/2022 Yue ...................... G09G 3/3233
2024/0282366 A1* 8/2024 Jacob ..................... H10B 10/00
2025/0037644 A1* 1/2025 Li ............................ G09G 3/32
2025/0374505 A1* 12/2025 Fujiwara .............. H10B 10/125

OTHER PUBLICATIONS

J.-K. Cho and M. Jeong, "A Low-Power Digital Pixel Driving Scheme for Single-Pulse-PWM-Based Display Using AND-Embedded Pixel Circuits," in IEEE Transactions on Circuits and Systems for Video Technology, vol. 29, No. 11, pp. 3382-3392, Nov. 2019, doi: 10.1109/TCSVT.2018.2875944.

* cited by examiner

METHODS AND SYSTEMS FOR REDUCING POWER CONSUMPTION OF ELECTRONIC DISPLAYS WITH IN-PIXEL SRAM CELL AND UNWEIGHTED PWM DRIVING SCHEME

CROSS-REFERENCE TO OTHER APPLICATIONS

The disclosure claims priority from U.S. Provisional Application No. 63/550,117 filed Feb. 6, 2024 which is hereby incorporated by reference.

FIELD

The disclosure is generally directed at electronic displays and, more specifically, at methods and systems for reducing power consumption of electronic displays with in-pixel SRAM or DRAM cells and unweighted pulse width modulation (PWM) scheme.

BACKGROUND

The daily use of electronic devices continues to grow with individuals relying on their devices to perform daily activities. From looking at weather forecasts to performing financial transactions, humans are becoming more and more reliant on their electronic devices. Regular and consistent use of these electronic devices, more specifically, portable electronic devices, results in a quicker draining of their battery and/or batteries which requires these devices to be more regularly charged. This can be problematic when an individual is not in a location to charge their device. One way to reduce the need for frequent charging is to reduce the power consumption of different components of or applications executing on the portable electronic device.

One component that draws a lot of power, or is a high-power consuming component, is the display. This is problematic when there is a limited battery size powering the portable electronic device. Also, there is a larger intrinsic capacitive load of column, or data, lines when the display is operating with a higher resolution. Another problem with current displays is that there is an increased dynamic power consumption with the increase in the resolution and/or refresh rate of the display.

Therefore, there is provided novel methods and systems for reducing power consumption in a low-power display using novel pixel circuits using SRAM cells.

SUMMARY

The disclosure is directed at methods and systems for reducing the power and/or energy consumption of electronic displays, such as, but not limited to, low-power AMOLED displays. In some embodiments, the disclosure is directed at reducing power and/or energy consumption in portable electronic device displays such as, but not limited to, inorganic micro-LED based active matrix displays, microdisplays for Near To Eye (NTE) applications, cell phones, tablets, and laptop computers where there is limited energy or power stored on a battery of the portable electronic device. The disclosure includes different embodiments of pixel circuits including SRAM cells that reduce the dynamic power consumption of the column drivers within AMOLED displays.

One way to increase the battery life of a portable device is to decrease the power consumption of the display, since it is a considerable portion of the total power consumption in portable devices. In general, in a display circuit, row drivers sequentially scan all rows in the display one at a time and repeat the same operation. The new data is driven via column drivers and stored in pixels on a given row. Each column is connected to the source of hundreds of access transistors and each of them contributes a capacitance to column lines. Therefore, the net capacitance of a column increases linearly by the number of rows in the display. As each row is scanned, these columns with high capacitance keeps toggling between 'data 1' and 'data 0', causing significant amount of dynamic power consumption.

In one aspect of the disclosure, there is provided a system for power consumption reduction in a display including a column driver for driving a set of column lines; a row driver for driving a set of row lines; and a set of 7T static random-access memory (SRAM)-based pixels, one of the set of 7T SRAM-based pixels associated with an intersection of one of the set of column lines and one of the set of row lines; wherein each of the set of 7T SRAM-based pixels includes a set of seven transistors, a driver transistor and a light emitting diode; and wherein each of the set of 7T SRAM-based pixels includes a first inverter including a first subset of the seven transistors; a second inverter including a second subset of the seven transistors, the second subset of transistors being different than the first subset of the seven transistors; wherein the first and second inverters are connected to form a latch to hold data for the pixel.

In another aspect, a gate of the driver transistor is connected to an output of the first inverter, and a source of the driver transistor is connected to low voltage, and a drain of the driver transistor is connected to a cathode of the light emitting diode and an anode of the light emitting diode is connected to high voltage. In a further aspect, the first inverter includes two transistors from the set of seven transistors. In yet another aspect, the second inverter includes three transistors from the set of seven transistors, the three transistors different from the two transistors of the first inverter. In yet a further aspect, a sixth transistor from the set of seven transistors, different from the two transistors for the first inverter and the three transistors of the second inverter, the sixth transistor acting as a pass gate for the pixel. In a further aspect, a gate of the sixth transistor is connected to its associated row line, a drain of the sixth transistor is connected to its associated column line, and a source of the sixth transistor is connected to an input of the first inverter. In yet another aspect, a seventh transistor, different from the two transistors for the first inverter, the three transistors of the second inverter and the sixth transistor, is a header for the pixel. In yet a further aspect, a gate of the seventh transistor is connected to its associated row line, a drain of the seventh transistor is connected to a high voltage of the first and second inverters, and a source of the seventh transistor is connected to a power supply.

In another aspect, the second inverter includes two transistors from the set of seven transistors, the two transistors different from the two transistors of the first inverter. In a further aspect, three transistors from the set of seven transistors act as switches, wherein the three transistors acting as switches are different than the transistors in the first and second inverters. In yet another aspect, two of the transistors acting as switches are row switches and one of the transistors acting as switches is an enable signal switch. In an aspect, a gate of the row switch, $Sw_r$, is connected to row line, ROW_r of the associated row, a source of the row switch $Sw_r$ is connected to low voltage, and a drain of the row switch $Sw_r$ is connected to the source of switch $Sw_e$. In another aspect, a gate of the row switch $Sw_s$ is connected to row line ROW_s of the associated row, a source of the row switch $Sw_s$ is connected to low voltage, and a drain of the row switch $Sw_s$ is connected to the output of second inverter. In yet a further aspect, a gate of the enable signal $Sw_e$ switch is connected to a column line enable signal, a source of the switch $Sw_e$ is connected to the drain of row-switch $Sw_r$, and a drain of the switch $Sw_e$ is connected to the output of first inverter.

In another aspect of the disclosure, there is provided a system for power consumption reduction in a display including a column driver for driving a set of column lines; a row driver for driving a set of row lines pairs, each row line pair including a first row and a second row; and a set of AND-Logic embedded 3T1C dynamic random-access memory (DRAM)-based pixels, one of the set of AND-Logic embedded 3T1C DRAM-based pixels associated with an intersection of one of the set of column lines and one of the set of row lines; wherein each of the set of AND-Logic embedded 3T1C DRAM-based pixels includes three transistors, a capacitor, a driver transistor and a light emitting diode; and wherein the three transistors (P1, $Sw_r$ and $Sw_e$) include two transistors acting as switches ($Sw_r$ and $Sw_e$) in series with each other.

In another aspect, the driver transistor with its gate terminal connected to the drain of transistor P1, and its source terminal connected to the low voltage, and its drain terminal connected to the cathode of a light emitting diode, and anode of the light emitting diode is connected to the high voltage.

BRIEF DISCLOSURE OF THE DRAWINGS

Figure 1B:
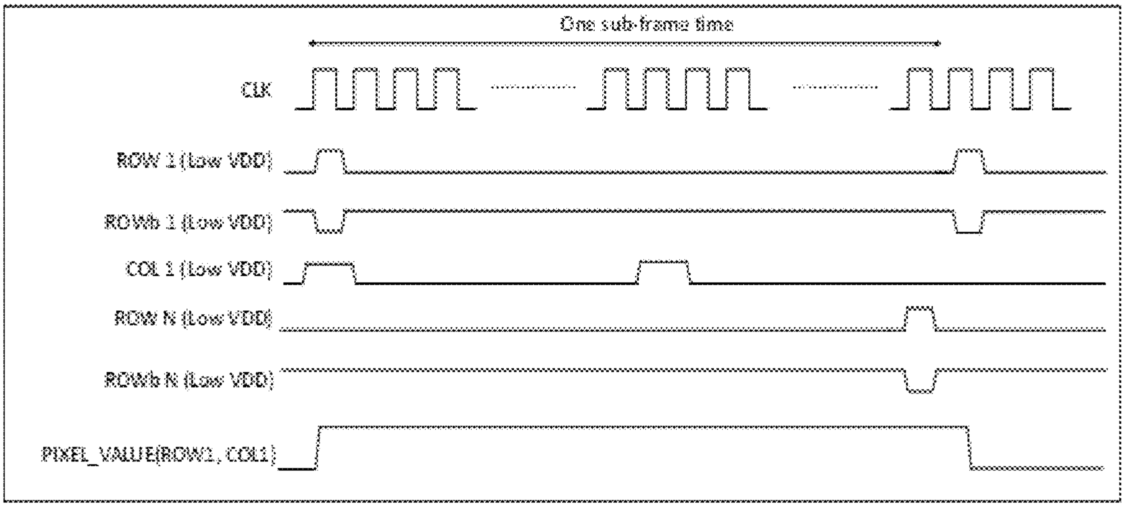

Some embodiments of the present disclosure are illustrated as an example and are not limited by the figures of the accompanying drawings, in which like references may indicate similar elements and in which:

FIG. 1*a* is a schematic diagram of a N*M AMOLED display in accordance with the disclosure;

FIG. 1*b* is a timing diagram of the display of FIG. 1*a;*

Figure 2A:
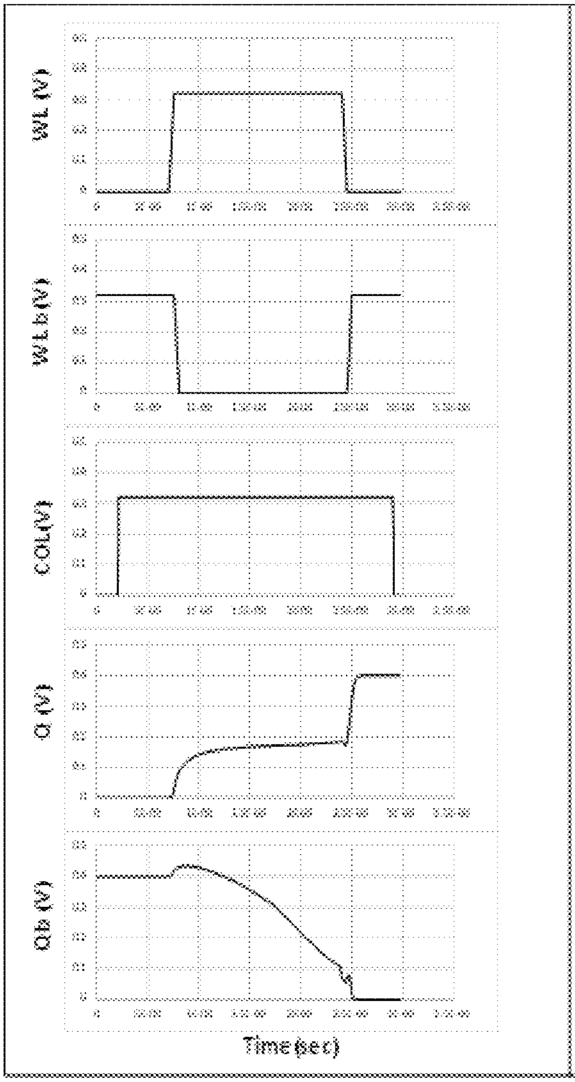

FIG. 2*a* is a set of graphs directed at a Write "1" operation for the display of FIG. 1*a;*

Figure 2B:
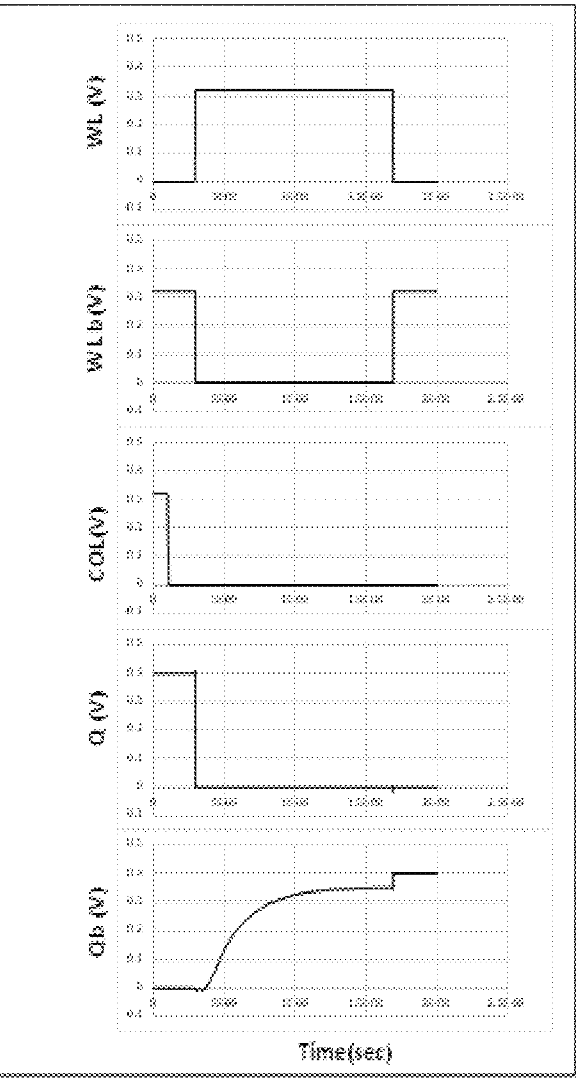

FIG. 2*b* is a set of graphs directed at a Write "0" operation for the display of FIG. 1*a;*

Figure 3:
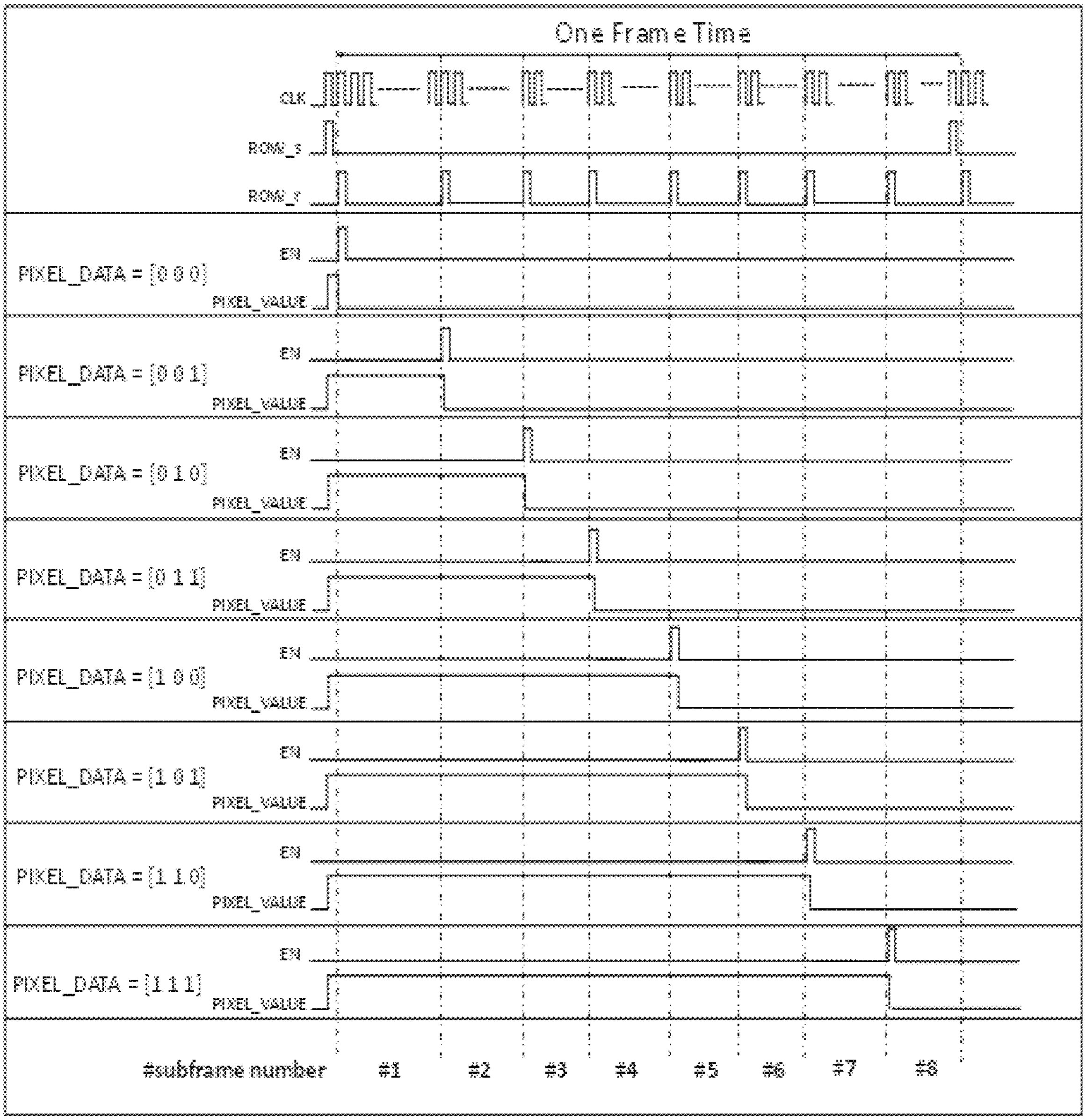

FIG. 3 is a set of waveforms for generating 3-bit unweighted pulse-width modulation for the display of FIG. 1*a;*

Figure 4A:
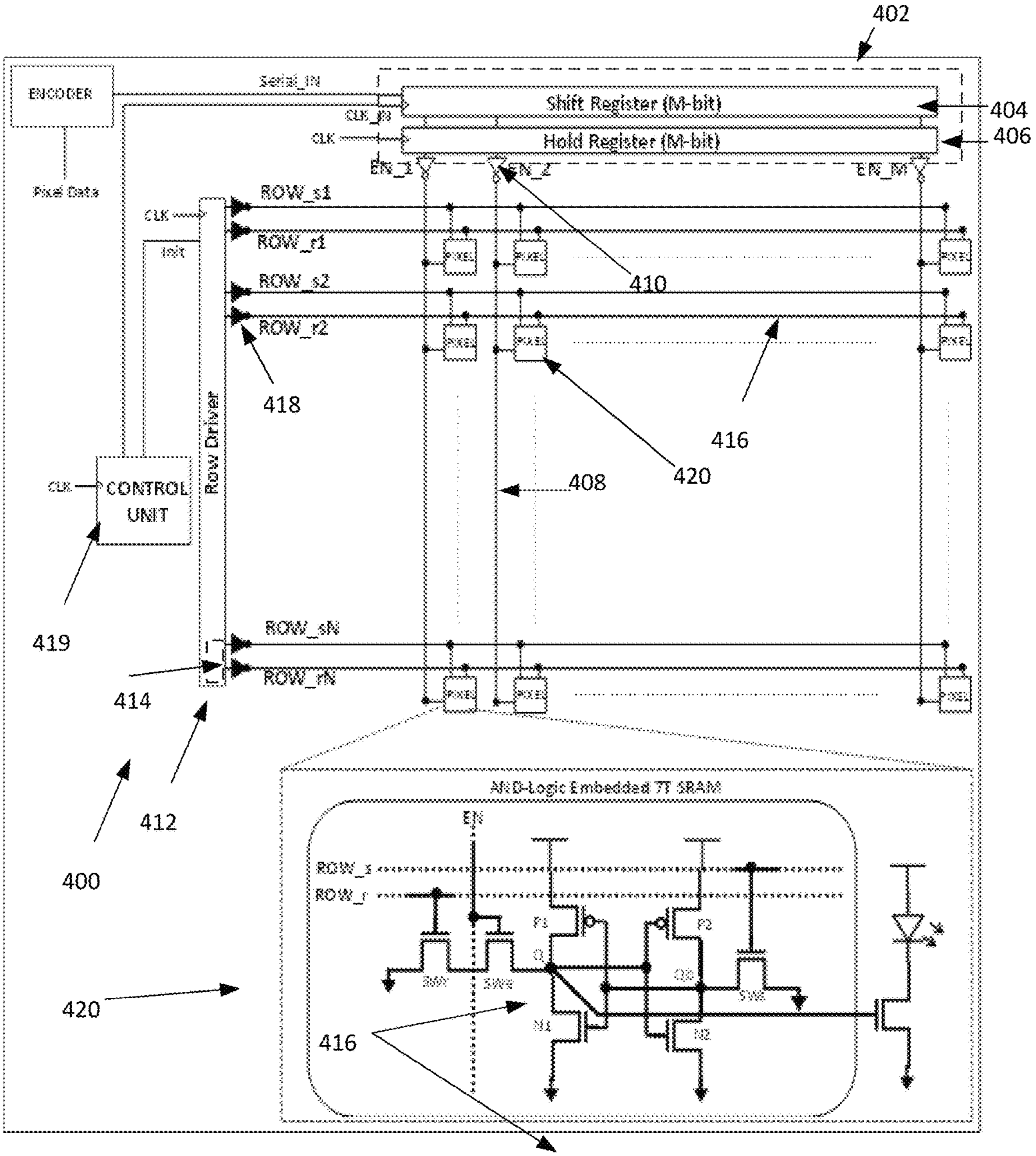
Figure 4B:
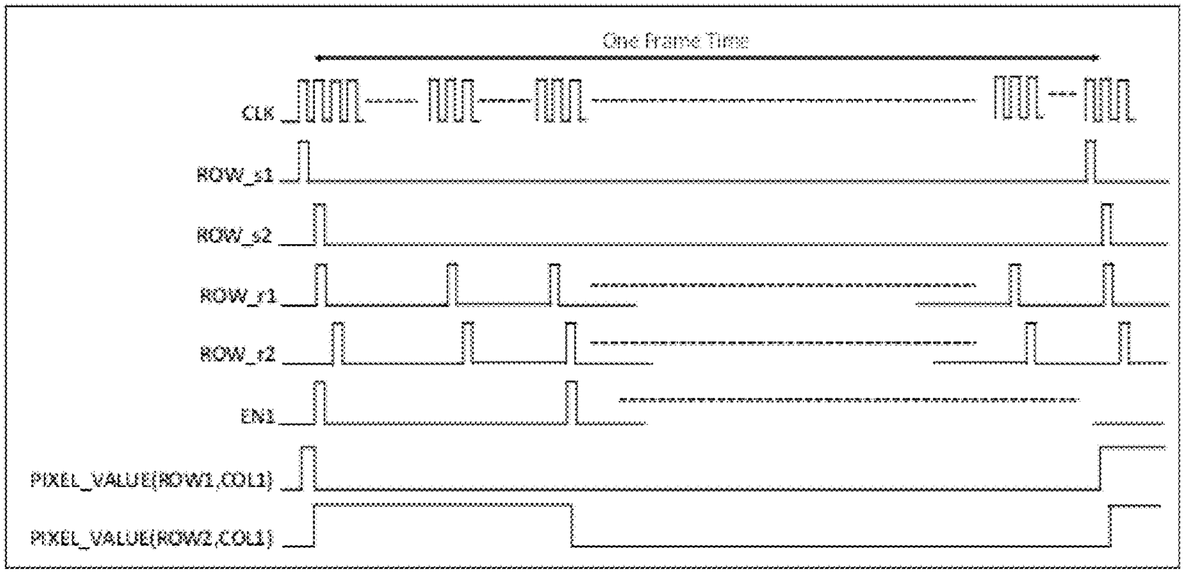

FIG. 4*a* is a schematic diagram of another embodiment of a N*M AMOLED display in accordance with the disclosure;

FIG. 4*b* is a timing diagram of the display of FIG. 4*a;*

Figure 5A:
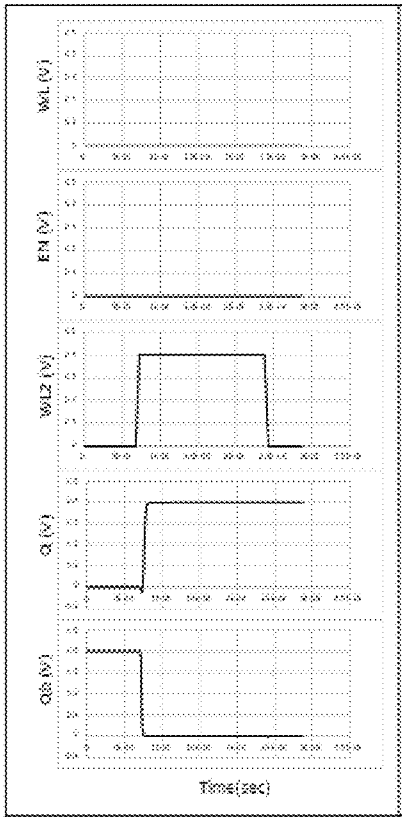

FIG. 5*a* is a set of graphs directed at a Write "1" operation for the display of FIG. 4*a;*

Figure 5B:
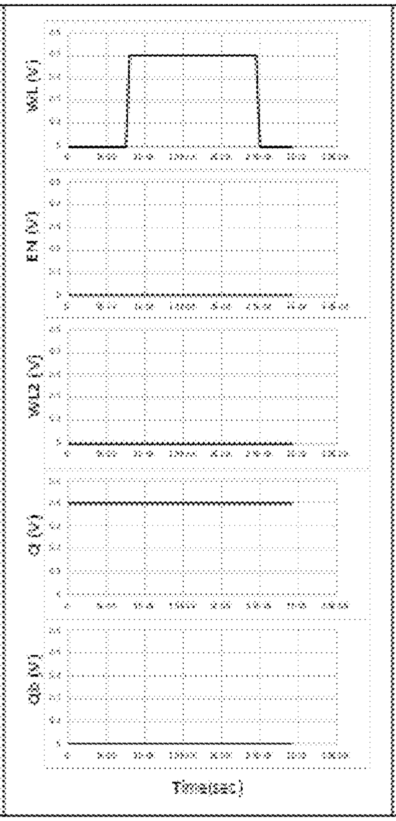

FIG. 5*b* is a set of graphs directed at a No Write operation for the display of FIG. 4*a;*

Figure 5C:
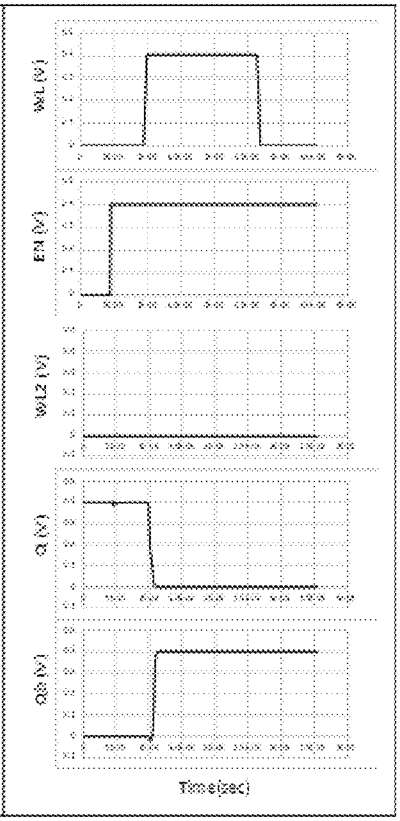

FIG. 5*c* is a set of graphs directed at a Write "0" operation for the display of FIG. 4*a;*

Figure 6A:
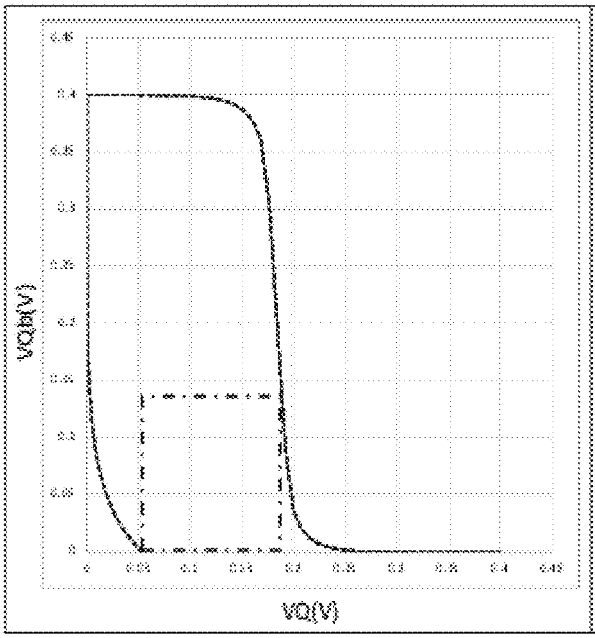
Figure 6B:
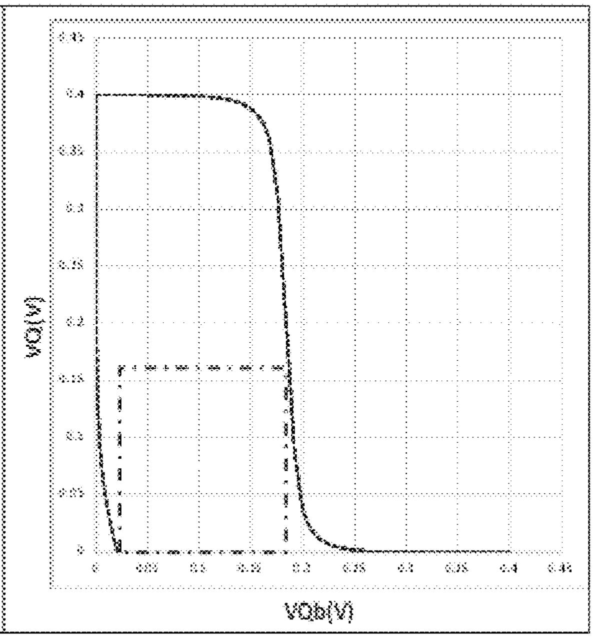
Figure 7:
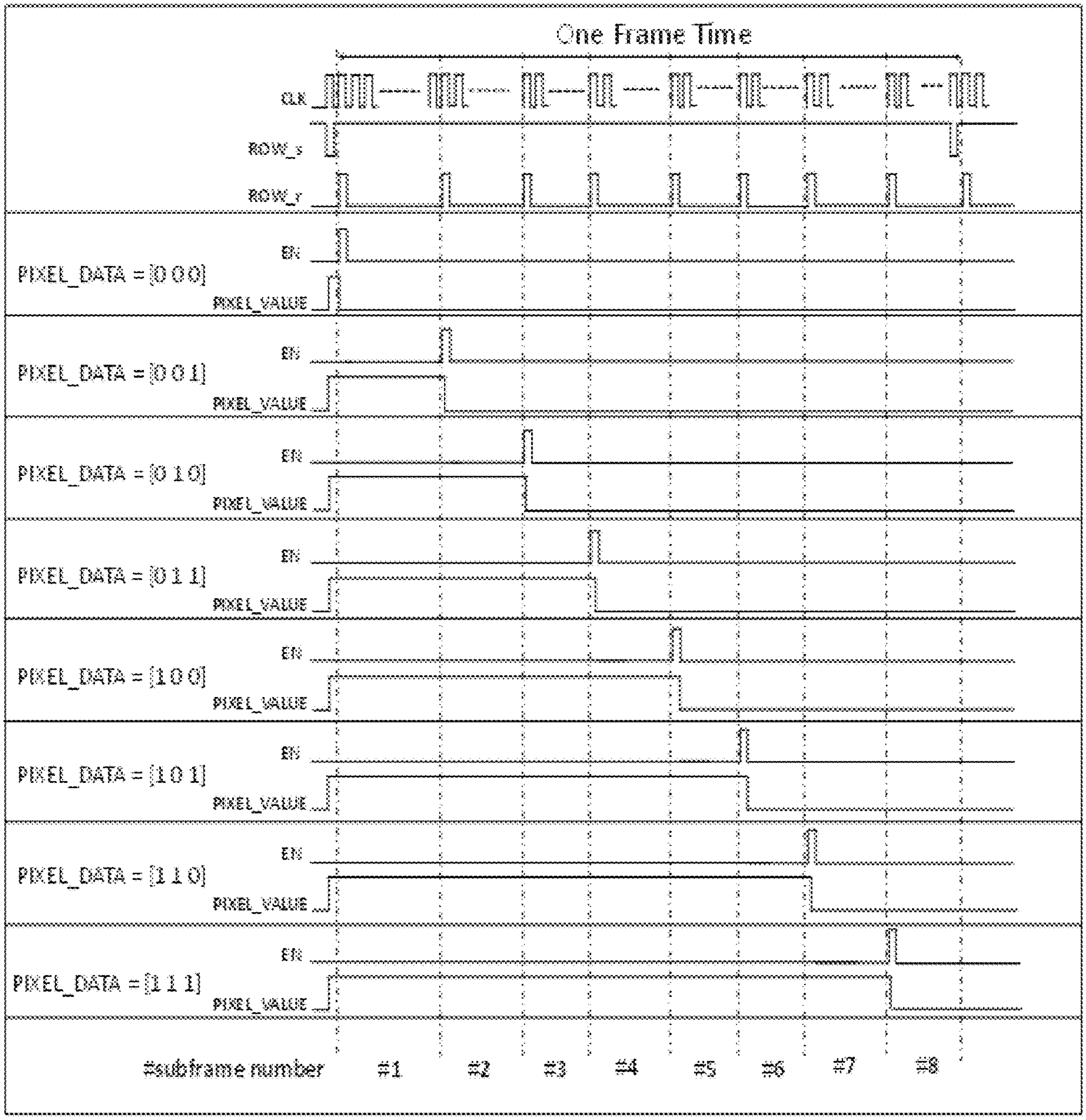

FIG. 6*a* is a graph showing write SNM margins for the display in FIG. 4*a* for a write "0" operation;

FIG. 6*b* is a graph showing write SNM margins for the display in FIG. 4*a* for a write "1" operation;

FIG. 7 is a set of waveforms for generating 3-bit unweighted pulse-width modulation for the display of FIG. 4*a;*

Figure 8A:
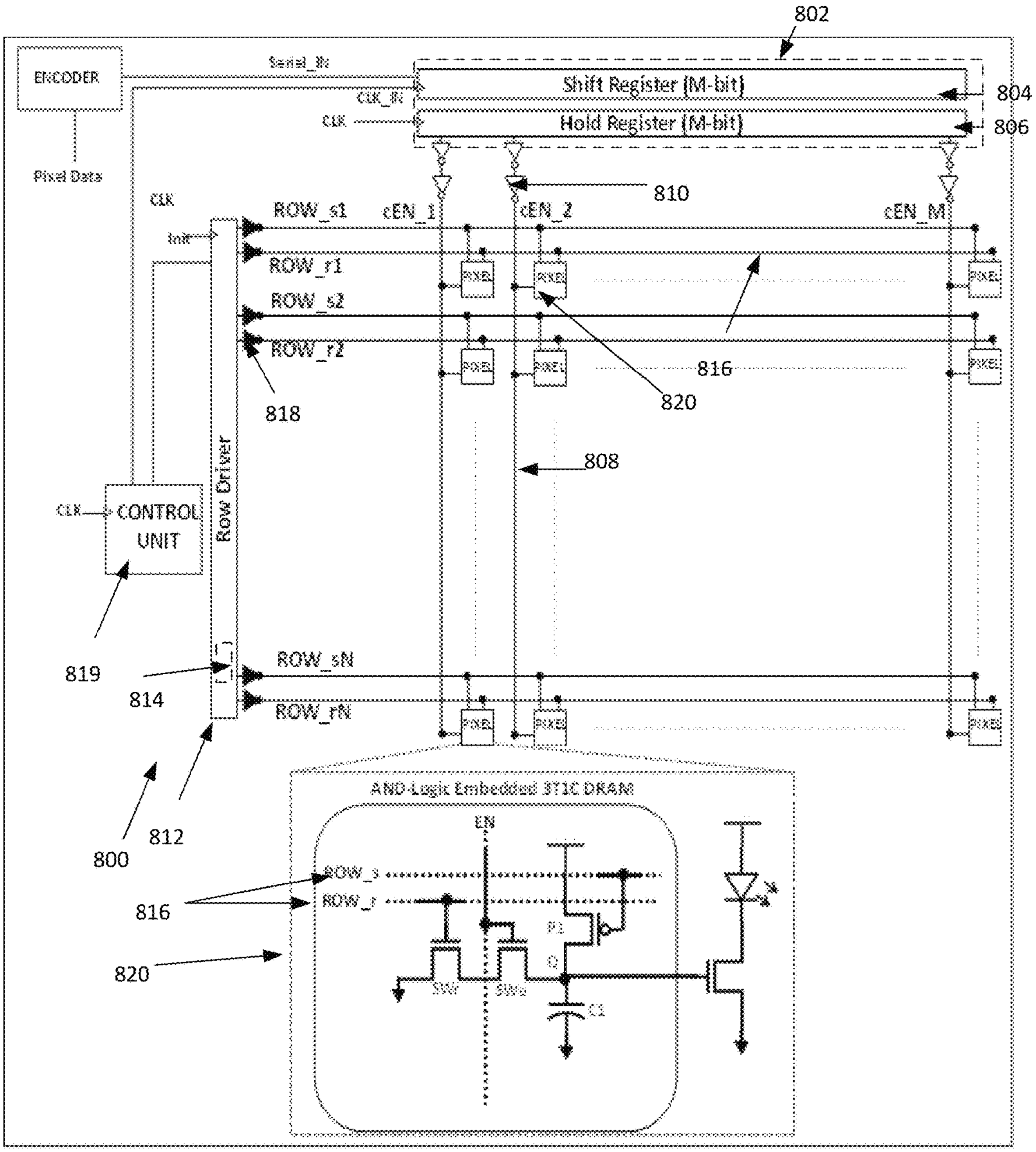
Figure 8B:
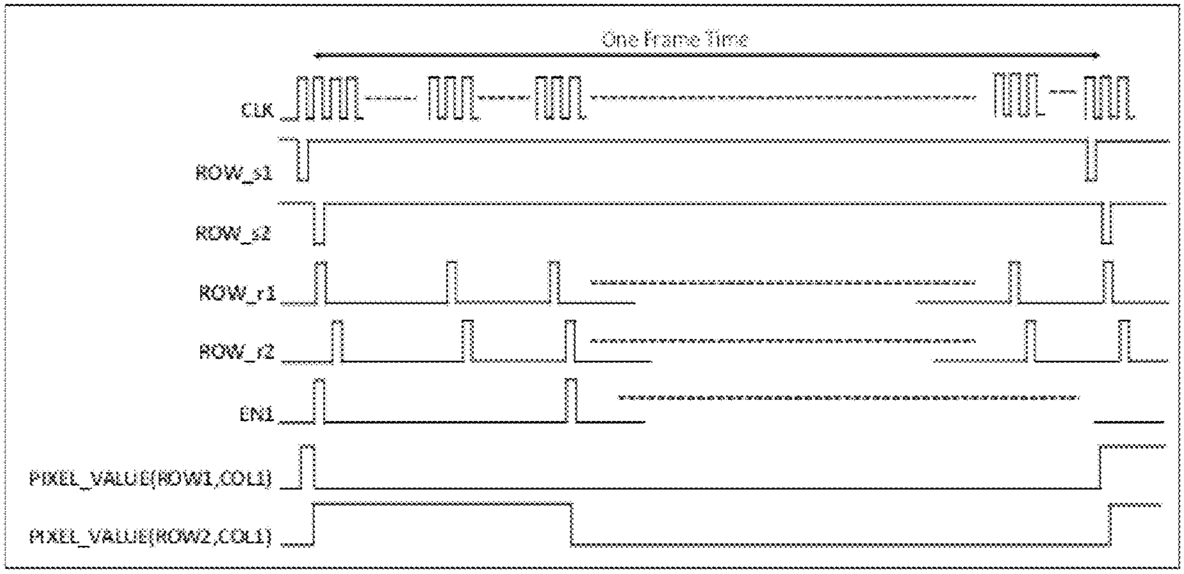

FIG. 8*a* is a schematic diagram of a further embodiment of a N*M AMOLED display in accordance with the disclosure; and FIG. 8*b* is a timing diagram of the display of FIG. 8*a.*

DETAILED DESCRIPTION OF THE EMBODIMENTS

The disclosure is directed at methods and systems for reducing the power and/or energy consumption of portable electronic displays or microdisplays.

In the disclosure, different embodiments of power consumption reduction apparatus for implementation within a display or electronic component are disclosed. Some embodiments may include at least one of a low-voltage driven 7T SRAM based pixel power consumption reduction apparatus; an AND-Logic embedded 7T SRAM based pixel for unweighted pulse width modulation (PWM) digitally driven displays power consumption reduction apparatus or an AND-Logic embedded 3T1C DRAM based pixel for unweighted PWM digitally driven displays power reduction consumption apparatus. In other words, the disclosure is directed at improvements in pixel technology for microdisplays or displays for portable electronic devices.

In some embodiments, low-power digitally driven displays including low-voltage driven 7T SRAM based pixels are used which reduce the dynamic power of column and row drivers within the displays. As dynamic power is directly proportional to a square of the voltage power supply, to reduce dynamic power consumption, a display including pixels with 7T SRAM cell where each pixel is connected to a single column line and two row lines is used. As the row line is activated, a header transistor in the 7T SRAM cell cuts-off the power supply to the cell, enabling a write operation with a lower voltage column line and row line.

In other embodiments, to reduce power consumption in unweighted PWM digitally driven displays, AND-logic embedded 7T SRAM based pixels are used. For an unweighted PWM digital driving method with a colour depth of 8 bits, there are 255 sub-frames (i.e., programming and emission times for pixels in a row) during each frame time. Therefore, in the unweighted PWM scheme, the image quality is uncompromised, however, the dynamic power consumption is high as a single frame is divided into 255 sub-frames and each column line data toggles with every row (depending on pixel data) in every sub-frame. The AND-logic embedded SRAM cells or based pixels reduce the number of required column line toggling and therefore, overall dynamic power consumption is reduced. In another embodiment, a display including "AND-logic embedded 3T1C DRAM based pixels" are used which occupy a smaller area on the display backplane compared to the AND-logic embedded 7T SRAM based pixel.

Turning to FIG. 1*a*, a schematic diagram of an N*M AMOLED display including low-voltage driven 7T SRAM based pixels or pixel circuits is shown.

The display 100 includes a column driver 102 which includes a shift register 104 and a hold register 106, both of size M, for driving a set of data, or column, lines 108. A set of data, or column, line buffers 110, with one data line buffer 110 associated with one of the set of data lines 108, is responsible to charge and discharge the data lines 108 with proper data values. The display 100 further includes a row driver 112, of size N, including at least one shift register 114 that enables a set of rows, or row line, pairs 116 via a set of row pair buffers 118 with one of the set of row pair buffers 118 associated with one of the set of row pairs 116. As shown in FIG. 1*a*, each row pair is labelled ROW_n and ROWb_n where "n" is a row number with a maximum value of "N". The display 100 further includes a control unit 119 that generates and/or transmits signals for operation of the display 100.

The display further includes a set of pixels 120, each of the pixels being a low voltage driven 7T SRAM based pixel and associated with an intersection between one of the set of row pairs 116 and one data, or column, lines 108. An exploded view of a pixel 120 is also included in FIG. 1*a*.

The pixel circuit 120, which may also be referred to as a 7T SRAM cell pixel, includes seven (7) transistors, labeled M1 to M7, as schematically shown in the enlarged section of FIG. 1*a*. Each pixel circuit 120 is connected to one of the row pairs 116, where each row pair 116 includes a pair of row lines labeled as ROW and ROWb (which are complementary versions of each other) and a column line 108 labeled COL. In a default state, the value on row line ROW is "0" and the value on row line ROWb is "1". The data is stored in nodes Q and Qb which are complementary versions of each other.

As shown in FIG. 1*a*, row line ROW is connected to gates of transistors M6 and M7 while row line ROWb is connected to a gate of transistor M5. The drain of transistor M6 is connected to column line COL. Transistor M7 acts as a header for the pixel circuit 120 and transistor M6 acts as a pass gate for the pixel circuit 120. The source of transistor M7 is connected to supply voltage while the drain of transistor M7 is connected to the drain of transistor M1 and the source of transistor M3. The source of transistor M6 is connected to the source of transistor M1 and the gates of transistors M3 and M4. This connection may be seen as node Q. The gate of transistor M1 is connected to the gate of transistor M2 and the source of transistor M4 and the drain of transistor M3. This connection point may be seen as node Qb. The drain of transistor M5 is connected to the drain of transistor M2.

Within each cell or pixel circuit 120 two inverter components are formed by some of the transistors wherein inverter1 is formed via the combination or path defined by transistors M1-M2-M5 and inverter2 is formed via the combination or path defined by transistors M3-M4. The inverter components are connected back-to-back to form a latch to hold the data. In operation, the gate and drain of transistor M6 which are connected to row line ROW and column line COL, respectively, write new data in the cell or pixel circuit.

Turning to FIG. 1*b*, a timing diagram for the pixel circuit 120 of FIG. 1*a* is shown. As discussed above with respect to an individual pixel circuit 120, each pixel circuit is associated with a pair of rows each including its own signal seen as signals from row line ROW and row line ROWb. In the default state, when the rows are not accessed, the values for row line ROW and for row line ROWb are '0' and '1', respectively. During scanning of the $1^{st}$ row (i.e. where n=1), the signal on row line ROW_1 is high and the signal on row line ROWb_1 is low. The data for the pixel circuit 120 is then fed through the column line COL signal. Here, the row line ROW, row line ROWb and column line COL signals are operated at a lower VDD. Since the dynamic power of the column driver is directly proportional to the square of VDD, as the VDD of the row and column drivers are lowered, a reduction with respect to the dynamic power consumption of the drivers is also experienced thereby reducing the power consumption of the display when in operation.

Write operations for the display shown in FIG. 1*a* are provided in FIGS. 2*a* and 2*b*. FIG. 2*a* is directed at a Write "1" operation or action while FIG. 2*b* is directed at a write "0" operation or action.

To 'write 0' in the pixel circuit, the signal on the column line COL is set to '0'. As row line ROW is activated for writing new data, the header transistor M7 is turned off which results in the pull up transistors M1 unable to assert logic 1 at node Q. Therefore, transistor M6 easily discharges the node Q to ground. As the row line ROW is deactivated, the header transistor M7 turns on, thereby storing 'data 1' at node Qb.

To 'write 1' in the pixel circuit, the signal on the column line COL is set to '1'. As the row line ROW is activated, complementary row line ROWb is deactivated by turning off transistor M5. Therefore, node Q starts charging through transistor M6. As transistor M6 starts charging, transistor M4 starts turning on and starts discharging node Qb. This in turn, starts turning off transistor M2 which turns on transistor M1. As the row line ROW is deactivated and complementary row line ROWb is activated, node Q is completely charged to VDD and stores the data '1' and node Qb is completely discharged to '0'.

During a write operation to update the pixel data (whereby the pixel value is going from "0" to "1" or "1" to "0"), transistors M5 and M7 are off, and node Q is floating and therefore charges or discharges depending on the data or data value in column line COL. The advantage of the pixel circuit 120 of FIG. 1*a* is that for both the column and row driver, VDD can be lowered and the number of column lines per pixel circuit or cell (i.e., '1' column line) required is also the same as conventional DRAM. Although, the number of row lines per cell is increased compared with current systems (two row lines ROW and ROWb vs one row line), the overall power consumption is reduced as the power consumption of each row line is significantly smaller compared to the column line COL.

Testing of the embodiment of FIG. 1*a* was performed using a simulation of the low voltage driven 7T SRAM based pixel circuit on a VGA display in TSMC 65 nm technology with a refresh rate of 60 Hz and the PWM driving method. Considering the power consumption needed to generate the controlling signals for this technique, the overall dynamic power consumption of the backplane circuit (row drivers, column drivers, control circuit, SRAM cells) was reduced by 31.3% on average for different test images with respect to conventional displays.

Turning to FIG. 4*a*, another embodiment of an N*M AMOLED display with power consumption reduction apparatus is shown. In the current embodiment, the display includes pixels that are implemented via AND-Logic embedded 7T SRAM based pixels or pixel circuits for unweighted PWM. As with the embodiment of FIG. 1*a*, use of SRAM based pixels provides power consumption reduction within the display when the display is in use.

In traditional digital pixel driving, a column-line driver writes "0" or "1" to a pixel memory during row scanning of the pixel. However, when an unweighted PWM scheme is used, the pixel memory value is not required to be changed for each row line access because the pixel needs to be updated only at the rising edge and falling edge of the pixel value. For example, for a 3-bit color depth and a pixel value of 4, the pixel memory needs to be updated only at the first sub-frame for setting pixel memory '1' and $5^{th}$ sub-frame for resetting pixel memory '0', as schematically shown in FIG. 3. This reduces the number of column line transitions in a frame time, which in turn reduces the dynamic power consumption of the column driver.

Turning back to FIG. 4*a*, the display 400 includes a column driver 402 which includes a shift register 404 and a hold register 406, both of size M, for driving a set of data lines 408. A set of data line buffers 410, with one column or data line buffer 410 associated with one of the set of column or data lines 408, is responsible to charge and discharge the column or data lines 408 with proper data values. The display 400 further includes a row driver 412, of size N, including at least one shift register 414 that enables a set of row or row line pairs 416 via a set of row buffers pair 418 with one of the set of row buffers pair 418 associated with one of the set of row pairs 416. As shown in FIG. 4*a*, each row pair is labelled ROW_sn and ROW_rn where "n" is a row number with a maximum value of "N". The display 400 further includes a signal generator or control unit 419 that generates and/or transmits signals for operation of the display 400.

The display further includes a set of pixels 420, each of the pixels being a AND-Logic embedded 7T SRAM based pixel and associated with an intersection between one of the set of row pairs 416 and one of the set of data, or column, lines 108. An exploded view of a pixel 420 is also included in FIG. 4*a*.

As shown in the exploded portion of FIG. 4*a*, the pixel 420 includes a set of seven (7) transistors (P1, N1, P2, N2, $Sw_r$, $Sw_e$ and $Sw_s$). In some embodiments, the transistors may act or operate as switches. A gate of transistor $Sw_r$ is connected to Row_r associated with the pixel while its source is connected to a drain of transistor $Sw_e$. A gate of the transistor $Sw_e$ is connected to the enable signal while its source is connected the gates of transistors P2 and N2, the source of transistor P1 and the drain of transistor N2 (which may be seen as node Q). It is understood that although some of the transistors are listed using "P" or "N" (representing PMOS or NMOS), the labelling refers to the current embodiment whereby in other embodiments, the transistors labelled P1, P2, N1 and N2 may be either PMOS or NMOS transistors.

The gate of transistor $Sw_s$ is connected to row line ROW_s while its drain is connected to the drain of transistor P2, the source of transistor N2, and the gates of transistors P1 and P2 (which may be seen as node Qb).

As shown in the exploded view, the pixel circuit 420 includes a pair of back-to-back inverters (created by the path or combination of transistors P1, N1, P2 and N2 where Inverter1 includes P1 and N1 and Inverter2 includes P2 and N2 and three transistors acting as switches (SWs, SWr and SWe). As discussed above, the gate of switch SWe is connected to an enable signal (such as one generated by the control unit 419) which runs across the column line 408. The cathode of an organic light emitting diode (OLED) is connected to the drain of the driver transistor. The gate of the driver transistor is connected to the 'node Q' of the SRAM cell, while its source is connected to the ground. Therefore, when the data stored at 'node Q' is '1'; driver transistor is 'on' and the current flow through OLED and the driver transistor. Consequently, the OLED emits the light. On the other hand when the data stored at 'node Q' is '0', the driver transistor is off and no current flows through OLED and the driver transistor. Consequently, OLED does not emit light.

FIG. 4*b* shows the timing diagram for the display of FIG. 4*a* for one frame time. Before the start of first sub-frame, row line ROW_s is activated, therefore setting the accessed pixel 120. Each pixel is then accessed sequentially in all the sub-frames. If the pixel value 3 (example shown in FIG. 4*b* for row line ROW_2 and column line COL_1), the enable signal is set to '1' during the fourth sub-frame, which resets the pixel. As a result, for a pixel value of '3', the OLED is on for first three sub-frame times.

Turning to FIGS. 5*a* to 5*c*, diagrams showing write operations for the display of FIG. 4*a* are shown with FIG. 5*a* directed at a Write "1" case or operation, FIG. 5*b* directed at a No write case or operation and FIG. 5*c* directed at a Write "0" case or operation.

In a default state, the signal or value for row line ROW_s and row line ROW_r are '0'. The two inverters (inverter1: P1-N1; inverter2: P2-N2) (which are connected back-to-back) form a latch to hold the data at node Q and Qb. When row line ROW_s is activated, SWs is turned 'on' and node Qb starts discharging to '0'. This starts to turn transistor P1 'on' and N1 'off' and the voltage at node Q starts to rise. As a result, P2 starts turning 'off', and node Qb discharges completely to '0' which results in P1 turning on completely and charging node Q to VDD and OLED is turned on. Similarly, when both the signals on row line ROW_r and the enable signal EN are activated at the same time, SWr and SWe are turned 'on' and node Q starts to discharge. This starts turning transistor P2 'on' and transistor N2 'off'. As a result, P1 starts turning 'off', and node Q discharges completely to '0' and OLED is turned off. If row line ROW_r is activated, and the enable signal EN is '0', the previous data stored in the cell or pixel circuit remains unaffected.

Turning to FIGS. 6*a* and 6*b*, graphs showing write SNM margins for the display in FIG. 4*a* for a write "0" case or operation (FIG. 6*a*) and a write "1" case or operation (FIG. 6*b*) are provided. The write SNM is defined as the maximum or a high noise that is to be injected at the internal nodes of the two inverters while it allows data to be flipped during writing.

To plot write SNM for 'write 0', the enable signal EN and the signal on row line ROW_r are connected to VDD for a voltage transfer characteristic (VTC) and an inverse VTC ($VTC^{-1}$). The VTC and $VTC^{-1}$ are plotted, as shown in FIGS. 6*a* and 6*b*. VQB vs VQ (voltages for the nodes) are plotted by sweeping VQ for the VTC, and VQ versus VQb by sweeping VQb for the $VTC^{-1}$. The write SNM is calculated graphically by computing the length of the largest square that can be inserted between the VTC and VTC-1 curves. It should be noted that there are no lobes on the butterfly curve during a successful write process. During a write operation, the SRAM cell is monostable which means that the SRAM can have or store only one data during writing i.e., the one that is being written. The cell will regain bistability if the VTC and $VTC^{-1}$ curves on the plot shift by an amount equal to the Write SNM. In other words, the SRAM can have either data during writing if the noise is more than the write SNM, which may lead to a write failure. To plot Write SNM for 'write 1', row line ROW_s is connected to VDD for VTC and $VTC^{-1}$ and the process is repeated. The graphs shown Write SNM of 135 mV at 0.4V for the pixel circuit.

The above paragraph teaches one aspect of the disclosure with respect to how low a voltage the display can handle without affecting operation of the display. In some embodiments, if a VDD value or level can be reduced, power consumption can also be reduced.

This may be determined by driving the display circuit while ensuring that it is still stable enough to write "1" or write "0".

Testing for the display of FIG. 4*a* was simulated on a VGA display in TSMC 65 nm technology with a refresh rate of 60 Hz and the PWM driving method. Considering the power consumption needed to generate the controlling signals for this technique, the overall dynamic power consumption of the backplane circuit (row drivers, column drivers, control circuit, SRAM cells) was reduced by 69.4% on average for different test images w.r.t. conventional displays.

Turning to FIG. 8$a$, another embodiment of an N*M AMOLED display with power consumption reduction apparatus is shown. In the current embodiment, the display includes pixels that are implemented via AND-Logic embedded 3T1C DRAM based pixels or pixel circuits. As with the other display embodiments, the novel pixels provide power consumption reduction within the display when the display is in use.

In traditional digital pixel driving, a column-line driver writes 0 or 1 to a pixel memory during row scanning of pixel. However, when UW-PWM scheme is used, the pixel memory value is not required to be changed for each row-line access. This is because the pixel needs to be updated only at the rising edge and falling edge of the pixel value. For instance, for a 3-bit color depth and a pixel value of 4, the pixel memory needs to be updated only at the first subframe for setting pixel memory '1' and $4^{th}$ subframe for resetting pixel memory '0', as shown in FIG. 7. This reduces number of column line transitions in a frame time, which in turn reduces the dynamic power consumption of column driver.

Turning back to FIG. 8$a$, the N*M AMOLED display 800 includes pixels 820 that are implemented via AND-Logic embedded 3T1C DRAM based pixel circuit for an unweighted PWM digitally driven display.

The display 800 includes a column driver 802 which includes a shift register 804 and a hold register 806, both of size M, for driving a set of data lines 808. A set of data line buffers 810, with one column or data line buffer 810 associated with one of the set of column or data lines 808, is responsible to charge and discharge the column or data lines 808 with proper data values. The display 800 further includes a row driver 812, of size N, including at least one shift register 814 that enables a set of row or row line pairs 816 via a set of row pair buffers 818 with one of the set of row buffers pair 818 associated with one of the set of row pairs 816. As shown in FIG. 4$a$, each row pair is labelled ROW_sn and ROW_rn where "n" is a row number with a maximum value of "N". The display 800 further includes a signal generator or control unit 819 that generates and/or transmits signals for operation of the display 800.

The display further includes a set of pixels 820, each of the pixels being a AND-Logic embedded 3T1C DRAM based pixel and associated with an intersection between one of the set of row pairs 816 and one of the set of data, or column, lines 808. An exploded view of a pixel 820 is also included in FIG. 8$a$.

As shown in the enlarged area of FIG. 8$a$, the pixel 820, or 3T1C DRAM cell, includes one capacitor (C1) to store charge, one PMOS transistor (P1) and two NMOS transistors or switches (SWr and SWe) that are positioned in series with a source of transistor $Sw_r$ connected to a drain of transistor $Sw_e$. Gates of transistor P1 (which may also be seen as a switch) and switch SWr are connected to row line ROW_s and row line ROW_r respectively. In another embodiment, transistor P1 may be a NMOS transistor and transistor or switches SWr and SWe may be PMOS. The gate of switch SWe is connected an enable signal (generated by the control unit 819) which runs across the column line. An OLED is connected to node Q of the cell. Node Q is also connected to a source of transistor P1 and the source of transistor $Sw_e$.

If data stored at 'node Q' is '1', the OLED is turned 'on', otherwise OLED remains 'off'. In general, PMOS technology is preferred to set a high voltage while NMOS is preferred when resetting to a low voltage.

In a default state, row line ROW_s is '1' and row line ROW_r is '0'. The capacitor C1 is used to hold the data at node Q. When the row line ROW_s turns to '0', P1 is turned 'on' and node Q starts charging to '1' and OLED is turned on. Similarly, when both row line ROW_r and the enable signal EN are activated at the same time, switches SWr and SWe are turned 'on' and node Q starts discharging and OLED is turned off. If row line ROW_r is activated, and he enable signal EN is '0', the previous data stored in the cell or pixel remains unaffected.

FIG. 8$b$ shows a timing diagram for the display circuit for display of FIG. 8$a$. Before the start of a first sub-frame, row line ROW_s is turned '1', therefore setting the accessed pixel. Followed by this, each pixel is accessed sequentially in all the sub-frames. If the pixel value 3 (the example shown in FIG. 8$b$ for ROW_2 and COL_1), the enable signal is set to '1' during the fourth sub-frame, which resets the pixel. As a results, for a pixel value of '3', the OLED is on for first three sub-frame times.

In development, the embodiments of FIGS. 4$a$ and 8$a$ were implemented on a TSMC 65 nm technology test-chip. The functionality of these test-chips and its dynamic power consumption were tested/simulated.

In some embodiments, the novel pixel of pixel circuits described above may be implemented within displays, such as, but not limited to, a portable display; a low-power display; a microdisplay; an AMOLED display; a microLED display, an OLEDOS display; cache memory and/or dual port memory.

Embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

Applicants reserve the right to pursue any embodiments or sub-embodiments disclosed in this application; to claim any part, portion, element and/or combination thereof of the disclosed embodiments, including the right to disclaim any part, portion, element and/or combination thereof of the disclosed embodiments; or to replace any part, portion, element and/or combination thereof of the disclosed embodiments.

The above-described embodiments are intended to be examples only. Alterations, modifications and variations can be effected to the particular embodiments by those of skill in the art without departing from the scope, which is defined solely by the claims appended hereto.

What is claimed is:

1. A system for power consumption reduction in a display comprising:

a column driver for driving a set of column lines;

a row driver for driving a set of row lines; and a set of 7T static random-access memory (SRAM)-based pixels, one of the set of 7T SRAM-based pixels associated with an intersection of one of the set of column lines and one of the set of row lines;

wherein each of the set of 7T SRAM-based pixels includes a set of seven transistors, a driver transistor and a light emitting diode;

wherein each of the set of 7T SRAM-based pixels includes:

a first inverter including a first subset of the seven transistors, the first subset including two transistors from the seven transistors;

a second inverter including a second subset of the seven transistors, the second subset including two transistors from the seven transistors different from the two transistors of the first inverter;

wherein the first and second inverters are connected to form a latch to hold data for the pixel;

wherein a gate of the driver transistor is connected to an output of the first inverter, and a source of the driver transistor is connected to low voltage, and a drain of the driver transistor is connected to a cathode of the light emitting diode and an anode of the light emitting diode is connected to high voltage;

wherein three transistors from the set of seven transistors act as switches, wherein the three transistors acting as switches are different than the transistors in the first and second inverters;

wherein two of the transistors acting as switches are row switches and one of the transistors acting as switches is an enable signal switch; and wherein at least one of:

a gate of the row switch ($Sw_r$) is connected to row line (ROW r) of the associated row, a source of the row switch ($Sw_r$) is connected to low voltage, and a drain of the row switch ($Sw_r$) is connected to the source of switch ($Sw_e$), a gate of the row switch ($Sw_s$) is connected to row line (ROW s) of the associated row, a source of the row switch ($Sw_s$) is connected to low voltage, and a drain of the row switch ($Sw_s$) is connected to the output of second inverter, and a gate of the enable signal ($Sw_e$) switch is connected to a column line enable signal, a source of the switch ($Sw_e$) is connected to the drain of row-switch ($Sw_r$) and a drain of the switch ($Sw_e$) is connected to the output of first inverter.

2. The system of claim 1 wherein the second inverter comprises three transistors from the set of seven transistors, the three transistors different from the two transistors of the first inverter.

3. The system of claim 2 wherein a sixth transistor from the set of seven transistors, different from the two transistors for the first inverter and the three transistors of the second inverter, the sixth transistor acting as a pass gate for the pixel.

4. The system of claim 3 wherein a gate of the sixth transistor is connected to its associated row line, a drain of the sixth transistor is connected to its associated column line, and a source of the sixth transistor is connected to an input of the first inverter.

5. The system of claim 4 wherein a seventh transistor, different from the two transistors for the first inverter, the three transistors of the second inverter and the sixth transistor, is a header for the pixel.

6. The system of claim 5 wherein a gate of the seventh transistor is connected to its associated row line, a drain of the seventh transistor is connected to a high voltage of the first and second inverters, and a source of the seventh transistor is connected to a power supply.

* * * * *